United States Patent
McCoy et al.

(10) Patent No.: US 6,591,816 B2
(45) Date of Patent: *Jul. 15, 2003

(54) MATRIX INJECTOR DRIVER CIRCUIT

(75) Inventors: John C. McCoy, Fayetteville, TN (US); Lou Vierling, East Detroit, MI (US)

(73) Assignee: Siemens VDO Automotive Corporation, Auburn Hills, MI (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/183,100

(22) Filed: Jun. 25, 2002

(65) Prior Publication Data

US 2002/0189594 A1 Dec. 19, 2002

Related U.S. Application Data

(62) Division of application No. 09/704,227, filed on Nov. 1, 2000.
(60) Provisional application No. 60/162,839, filed on Nov. 1, 1999.

(51) Int. Cl.[7] .............................................. F02M 51/00
(52) U.S. Cl. ...................................... 123/490; 123/445
(58) Field of Search ............................... 123/445, 472, 123/476, 490; 361/191, 172

(56) References Cited

U.S. PATENT DOCUMENTS

| | | | |
|---|---|---|---|
| 3,942,485 A | | 3/1976 | Suda et al. |
| 4,905,120 A | | 2/1990 | Grembowicz et al. |
| 5,499,157 A | | 3/1996 | Younessi et al. |
| 5,515,830 A | * | 5/1996 | Arakowa ..................... 123/490 |
| 5,531,198 A | * | 7/1996 | Matsuura ..................... 123/294 |
| 5,532,526 A | * | 7/1996 | Ricco et al. ................. 123/490 |
| 5,621,604 A | * | 4/1997 | Carlson ....................... 123/490 |
| 5,936,827 A | | 8/1999 | Dressler et al. |
| 5,941,216 A | * | 8/1999 | Arakawa ..................... 123/490 |
| 6,102,008 A | * | 8/2000 | Maeda et al. ............... 123/490 |
| 6,123,058 A | * | 9/2000 | Endou ......................... 123/490 |
| 6,129,073 A | * | 10/2000 | Yamakado et al. ......... 123/490 |

FOREIGN PATENT DOCUMENTS

JP    9189253    7/1997

* cited by examiner

Primary Examiner—John Kwon

(57) ABSTRACT

A fuel injector control circuit reduces the number of gates required by arranging high side and low side gates in a matrix. Each coil is selectively activated by activating a unique pair of a high side gate and a low side gate, thus reducing the total number of gates required.

15 Claims, 5 Drawing Sheets

MATRIX INJECTOR DRIVER CIRCUIT

RELATED APPLICATIONS

This application is a division of U.S. Ser. No. 09/704,227, filed Nov. 1, 2000, which claims priority to U.S. Provisional Application No. 60/162,839, filed Nov. 1, 1999.

BACKGROUND OF THE INVENTION

The present invention relates generally to fuel injector control circuits.

Known fuel injector control circuits generally comprise an open coil and a close coil for each fuel injector. To inject fuel into the cylinder, it is necessary to activate the open coil and then the close coil. Some applications require that the close coil on a given cylinder be activated before the associated open coil is deactivated. This is known as simultaneous excitation.

Known fuel injector fuel circuits connect each coil to the power supply with a different switch (such as a FET or other gate). Thus, for an 8 cylinder engine, 16 high side gates were required, each with associated drive circuitry.

When a coil is energized, some energy is stored in a magnetic field that surrounds the coil. When the coil is de-energized, it is desirable to recover some of the energy that was stored in the magnetic field. This energy recovered is done by a known technique called "recirculation."

SUMMARY OF THE INVENTION

The present invention provides cost saving by reducing the number of high side gates and the associated drive circuitry from 16 to as few as 4 (for an eight cylinder engine). Various configurations are illustrated herein, with different benefits and features in each. However, as a general principal, each of these utilizes high and low side gates which selectively activate selected coils via a matrix.

BRIEF DESCRIPTION OF THE DRAWINGS

Other advantages of the present invention will be readily appreciated as the same becomes better understood by reference to the following detailed description when considered in connection with the accompanying drawings wherein.

DETAILED DESCRIPTION OF A PREFERRED EMBODIMENT

Figure 1:
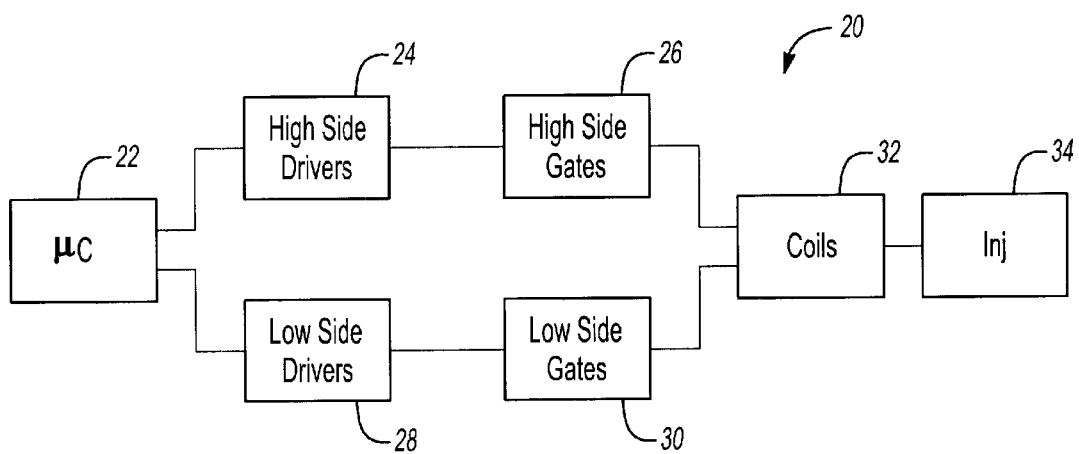
FIG. 1 is a high-level schematic of the fuel injector control system of the present invention.

A fuel injector control circuit 20 is shown schematically in FIG. 1. A microcontroller 22 is programmed generally to control high side drivers 24 to drive high side gates 26 and low side drivers 28 to drive low side gates 30. The high side gates 26 and low sides gates 30 selectively activate coils 32, which in turn selectively activate injectors 34.

Generally, the present invention reduces the number of high side gates 26. This is accomplished by treating the coils as a matrix, wherein each coil is selected by selective activation of one of the high side gates and one of the low side gates.

Figure 2:
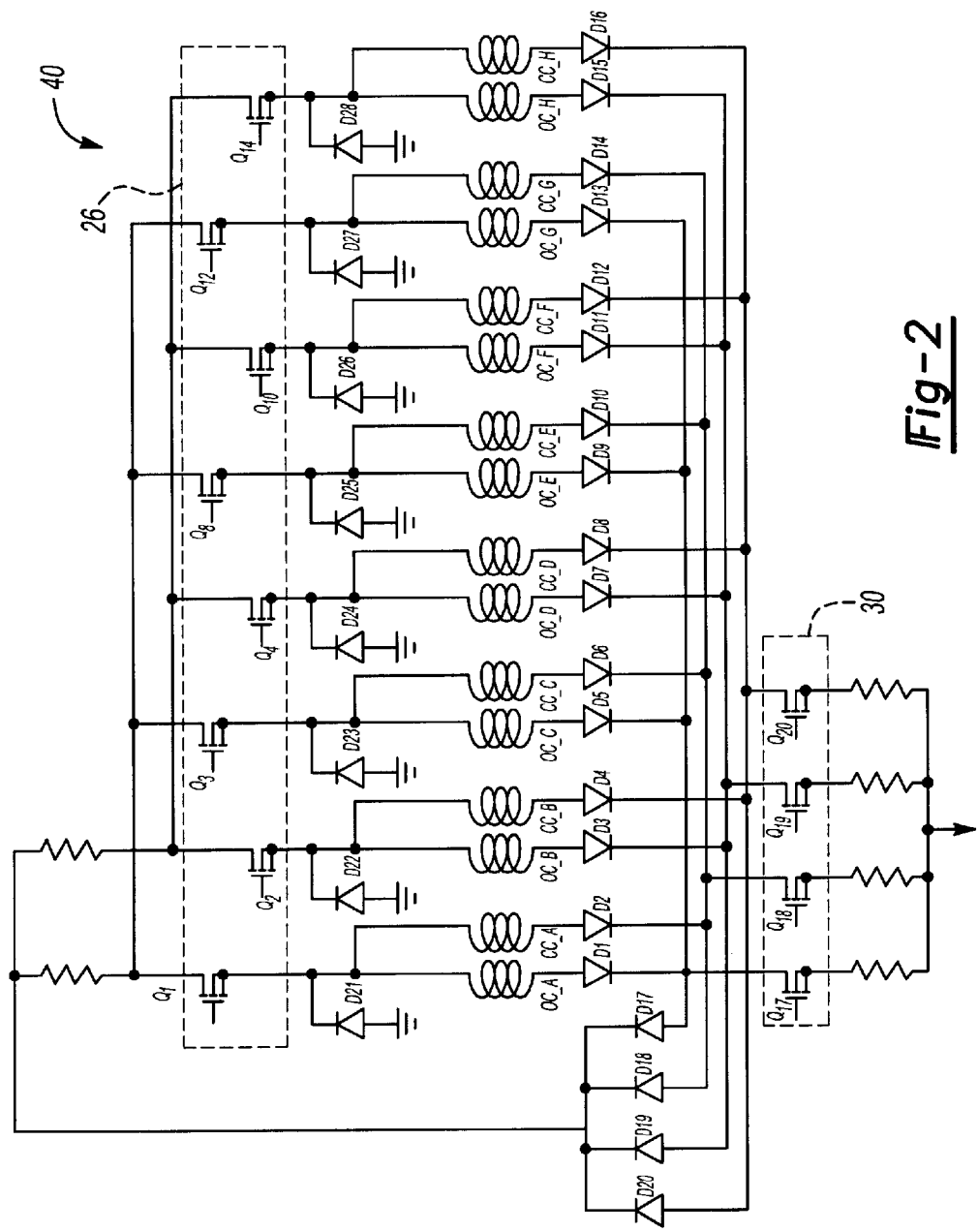
FIG. 2 is a schematic for a first circuit for controlling coils according to the present invention.

For example, a first circuit 40 is shown generally in FIG. 2, including high side gates 26, including gates Q1, Q2, Q5, Q6, Q9, Q10, Q13, Q14. The circuit 40 further includes low side gates 30, including Q17–Q20. This circuit 40 illustrates 16 coils OC_A–H and CC_A–H. In the circuit 40, high side gate Q1 connects odd coil OC_A and odd coil CC_A selectively to power supply. In circuit 40, each of the high side drivers connects the open coil and associated close coil for one of the 8 injectors.

The low side gates 30, Q17–Q120 selectively connect different groups of the coils to ground. For example, as can be seen in FIG. 2, Q17 selectively connects the odd open coils, Q18 selectively connects the odd close coils, Q19 selectively connects the even open coils and Q20 selectively connects the even close coils. Thus, any one of the 16 coils can be selectively individually activated by switching on the proper pair of a high side gate 26 and a low side gate 30. The diodes D1–D16 are placed in series with each coil and prevent interaction between the coils. The operation of the first circuit 40 is further demonstrated in the following table.

TABLE 1

|  | Q17 Low side driver for odd open coils | Q18 Low side driver for odd close coils | Q19 Low side driver for even open coils | Q20 Low side driver for even open coils |
|---|---|---|---|---|
| Q1 High side driver for cyl. A | OC_A | CC_A | | |
| Q2 High side driver for cyl. B | | | OC_B | CC_B |
| Q5 High side driver for cyl. D | OC_C | CC_C | | |
| Q6 High side driver for cyl. D. | | | OC_D | CC_D |
| Q9 High side driver for cyl. E | OC_E | CC_E | | |
| Q10 High side driver for cyl. F | | | OC_F | CC_F |
| Q13 High side driver for cyl. G | OC_G | CC_G | | |
| Q14 High side driver for cyl. H | | | OC_H | CC_H |

In this example, because gates are connected on common points on the high side of open and close coils in the same cylinder, simultaneous excitation cannot be performed. On the other hand, the advantages of this configuration include that the failure of one high side gate will only disable one cylinder and that three wire coils (with the high side connection with both open and close coils on the same wire) can be used.

A preferred method and apparatus for controlling of low side gates 30 is disclosed in co-pending patent application U.S. Ser. No. 09/703,537 entitled "CONTROL OF DRIVER CURRENT VIA LOW SIDE GATES" filed on the same date as this application, the assignee and inventors of which are the same as the assignee and inventors of this patent application, and which is hereby incorporated by reference fully as if repeated herein.

Figure 3:
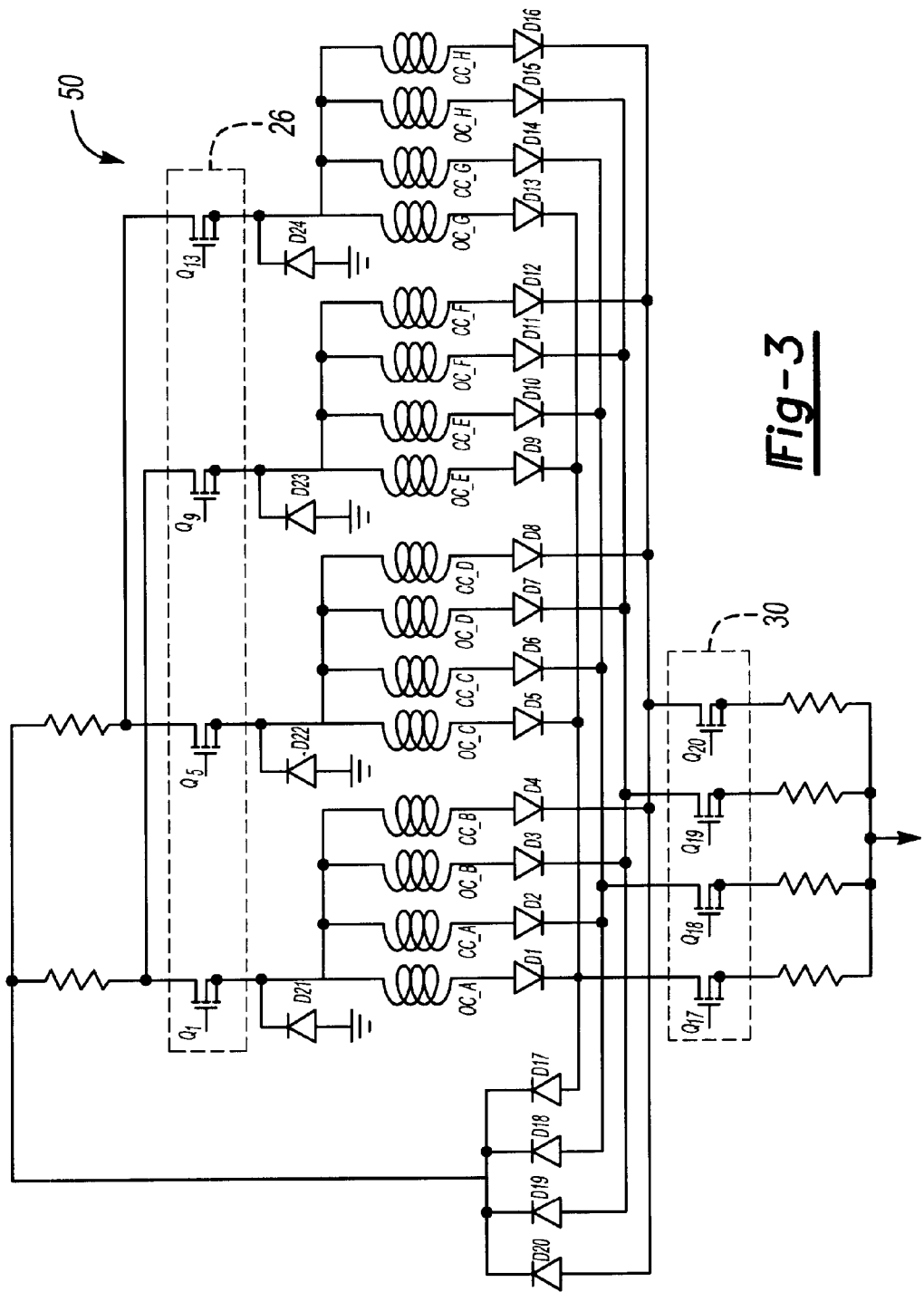
FIG. 3 is a schematic of a second, alternate circuit for controlling coils according to the present invention.

FIG. 3 illustrates a second circuit for activating the coils. As can be seen, the second circuit 50 requires only 4 high side gates. In the circuit 50, each of the high side gates, Q1, Q5, Q9 and Q13 operates the open and close coils for two cylinders. Low side gates 30, Q17–Q20, operate identically as in FIG. 2. Thus in this circuit 50, any of the coils can be selectively activated by switching the appropriate pair of high and low side gates. This is shown in the Table 2 below.

TABLE 2

|  | Q17 Low side driver for odd open coils | Q18 Low side driver for odd close coils | Q19 Low side driver for even open coils | Q20 Low side driver for even open coils |
|---|---|---|---|---|
| Q1 High side driver for cyl. A and B | OC_A | CC_A | OC_B | CC_B |
| Q5 High side driver for cyl. C and D | OC_C | CC_C | OC_D | CC_D |
| Q9 High side driver for cyl. E and F | OC_E | CC_E | OC_F | CC_F |
| Q13 High side driver for cyl. G and H | OC_G | CC_G | OC_H | CC_H |

Some advantages of this configuration are that the failure of one high side FET will only disable two cylinders, this configuration only utilizes four high side gates and that this version allows the use of three wire coils. The disadvantage of this configuration is that simultaneous excitation of the open and close coils on the same cylinder is not possible.

Figure 4:
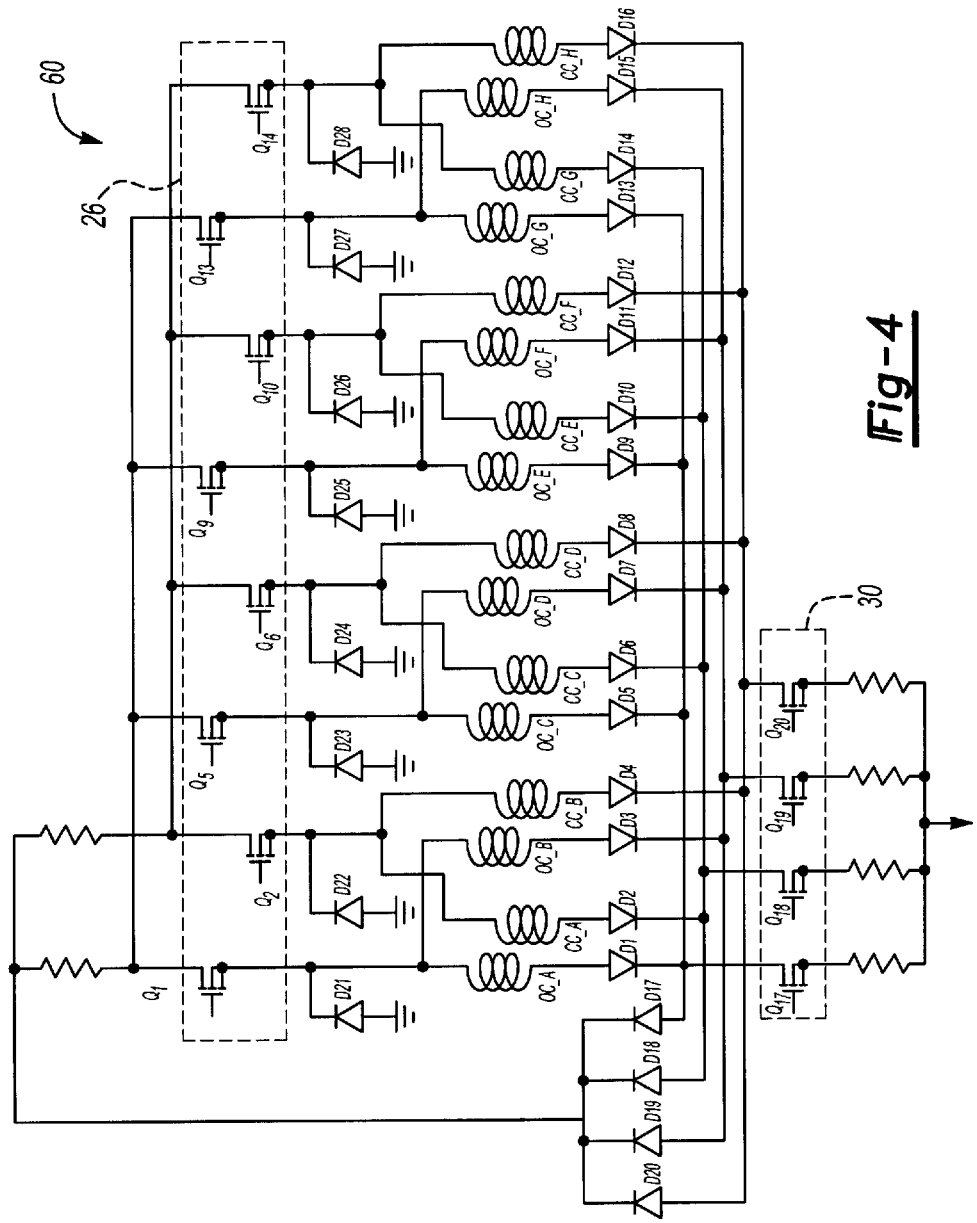
FIG. 4 is a schematic for a third circuit for controlling coils according to the present invention.

FIG. 4 illustrates a third circuit 60 for operating the fuel injector coils for operating. In this third circuit 60, 8 high side gates Q1, Q2, Q5, Q6, Q9, Q10, Q14 are no longer connected to two coils in the same cylinder (as in FIG. 3). Rather, each high side gate Q1, Q5, Q9, Q13 is connected to a pair of open coils (one even, one odd), while the gates Q2, Q6, Q10 and Q14 are connected to a pair of close coils (one even, one odd). The low side gates 30 operate as described above with respect to FIG. 1 in this third circuit 60. Because the open and close coils on any cylinder do not share any high side driver, simultaneously excitation can be utilized. The operation of this circuit 60 is further described in the Table 3, below.

TABLE 3

|  | Q17 Low side driver for odd open coils | Q18 Low side driver for odd close coils | Q19 Low side driver for even open coils | Q20 Low side driver for even open cells |
|---|---|---|---|---|
| Q1 High side driver for cyl. A and B open coils | OC_A |  | OC_B |  |
| Q2 High side driver for cyl. A and B close coils |  | CC_A |  | CC_B |
| Q5 High side driver for cyl. C and D open coils | OC_C |  | OC_D |  |
| Q6 High side driver for cyl. C and D close |  | CC_C |  | CC_D |
| Q9 High side driver for cyl. E and F open coils | OC_E |  | OC_F |  |
| Q10 High side driver for cyl. E and F close coils |  | CC_E |  | CC_F |
| Q13 High side driver for cyl. G and H open coils | OC_G |  | OC_H |  |
| Q14 High side driver for cyl. G and H close |  | CC_G |  | CC_H |

Figure 5:
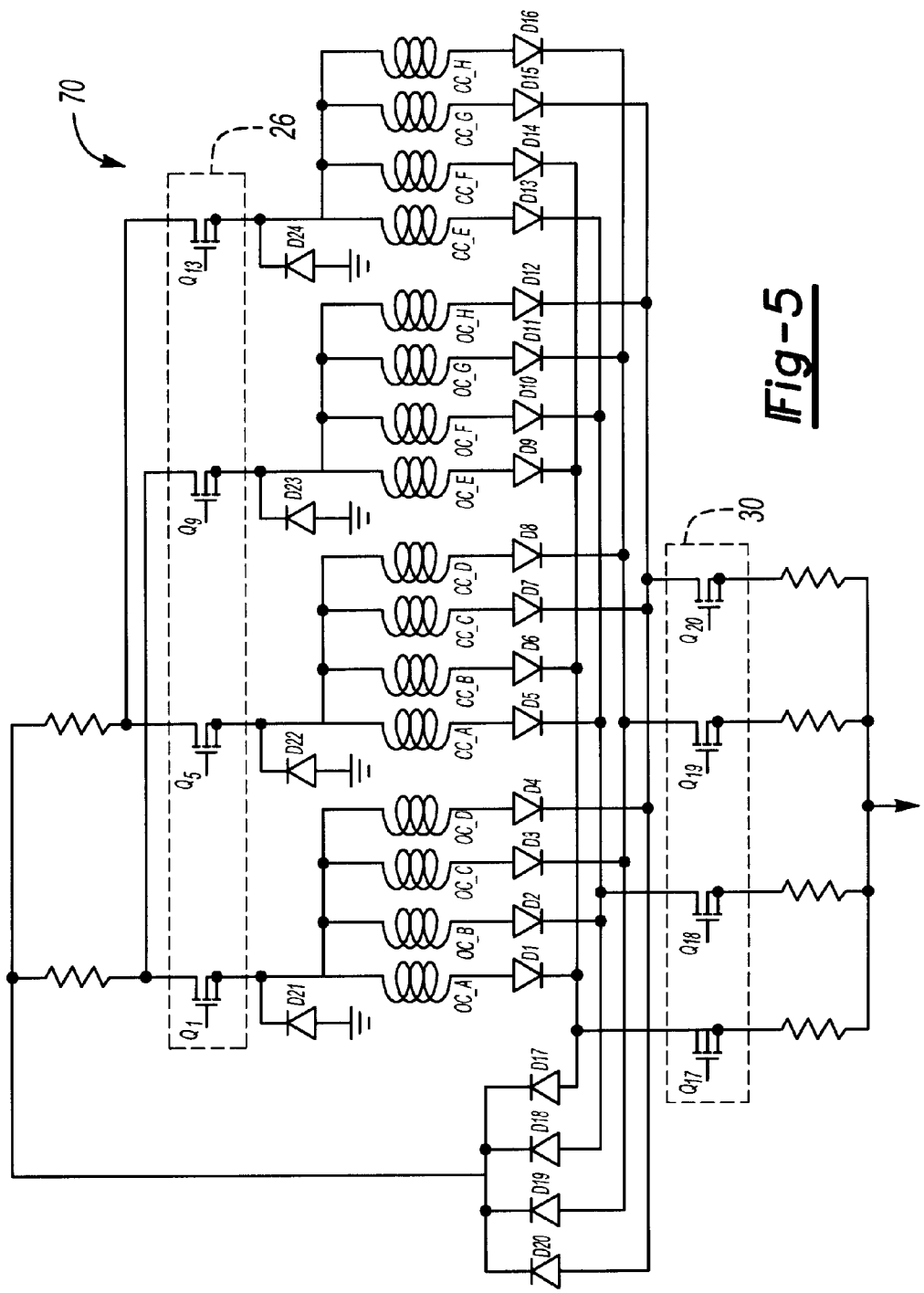
FIG. 5 is a schematic of a fourth alternate circuit for controlling coils and according to the present invention.

FIG. 5 illustrates a fourth schematic 70 including 4 high side gates, Q1, Q5, Q9 and Q13. High side gate Q1 selectively connects open coils A, B, C, D to power supply, while Q5 selectively connects close coils A, B, C, D. Similarly, gate Q9 selectively connects open coils E, F, G, H to the power supply while gate Q13 selectively connects close coils E, F, G, H to the power supply. In schematic 70, the low side gates 30 are configured differently, as shown. Gate Q17 selectively connects open coils 1 and 5 and close coils 2 and 6 to ground. The operation of the remaining gates and activation of the remaining coils are illustrated in the following table as well as in schematic FIG. 5.

TABLE 4

|  | High Side Driver Q1 1–4 Open Coils | High Side Driver Q5 1–4 Close Coils | High Side Driver Q9 5–8 Open Coils | High Side Driver Q13 5–8 Close Coils |
|---|---|---|---|---|
| Low Side Driver Q17 1 and 5 Open 2 and 6 Close | Open Coil #1 | Close Coil #2 | Open Coil #5 | Close Coil #6 |
| Low Side Driver Q18 2 and 6 Open 1 and 5 Close | Open Coil #2 | Close Coil #1 | Open Coil #6 | Close Coil #5 |
| Low Side Driver Q19 3 and 7 Open 4 and 8 Close | Open Coil #3 | Close Coil #4 | Open Coil #7 | Close Coil #8 |
| Low Side Driver Q20 4 and 8 Open 3 and 7 Close | Open Coil #4 | Close Coil #3 | Open Coil #8 | Close Coil #7 |

The circuit 70 enables both recirculation and overlap by a more creative arrangement of the low side drivers. On any given cylinder the open coil and close coil do not share either a high side driver or a low side driver.

As shown above, the present invention reduces the number of gates and associated driver circuitry required, thus reducing cost. Some embodiments described still permit simultaneous excitation and recirculation. Of course, although a few arrangements have been described, additional different arrangements utilizing the inventive concepts described herein could also be utilized.

In accordance with the provisions of the patent statutes and jurisprudence, exemplary configurations described above are considered to represent a preferred embodiment of the invention. However, it should be noted that the invention can be practiced otherwise than as specifically illustrated and described without departing from its spirit or scope.

What is claimed is:

1. A fuel injector control circuit comprising:
   a plurality of coils, including a plurality of open coils and a plurality of close coils;
   a plurality of first gates each selectively connecting more than one of said plurality of open coils to a power supply;
   a plurality of second gates each selectively connecting more than one of said plurality of close coils to the power supply; and
   a plurality of third gates selectively connecting said plurality of coils to ground.

2. The circuit of claim 1 wherein said plurality of first gates do not selectively connect any of said plurality of close coils to the power supply.

3. The circuit of claim 2 wherein said plurality of second gates do not selectively connect any of said plurality of open coils to the power supply.

4. The circuit of claim 3 wherein each of said plurality of second gates selectively connects more than one of said plurality of open coils to ground or more than one of said plurality of close coils to ground.

5. The circuit of claim 1 each of said plurality of third gates selectively connects at least four of said coils to ground.

6. The circuit of claim 5 wherein at least one of said plurality of third gates selectively connects at least four of said open coils to ground.

7. The circuit of claim 5 wherein at least one of said plurality of third gates selectively connects at least four of said close coils to ground.

8. A fuel injector control circuit comprising:

a plurality of coils including a plurality of open coils and a plurality of close coils;

a first plurality of high side gates each selectively connecting more than one open coil to a power supply;

a second plurality of high side gates each selectively connecting more than one close coil to the power supply;

a plurality of low side gates, each selectively connecting at least two of said plurality of coils to ground, including a first low side gate selectively connecting at least two of said close coils to ground, and a second low side gate selectively connecting at least two of said open coils to ground.

9. The circuit of claim 8 wherein each said low side gate selectively connects at least four coils to ground.

10. The circuit of claim 8 wherein a first half of said low side gates selectively connects only open coils to ground.

11. The circuit of claim 10 wherein a second half of said low side gates selectively connects only close coils to ground.

12. The circuit of claim 8 wherein said plurality of high side gates is twice the number of said plurality of low side gates.

13. A method for controlling a plurality of fuel injectors including the steps of:

a) associating each of a plurality of pairs of coils with each of a plurality of fuel injectors, each said pair comprising an open coil and a close coil;

b) selectively connecting at least two of the open coils to a power source with one of a plurality of high side gates;

c) selectively connecting at least two of said open coils to ground with a first low side gate;

d) selectively connecting at least two of said close coils to ground with a second low side gate; and e) activating each of said coils based upon activation of a unique pair of one of said high side gates and one of said low side gates.

14. The method of claim 13 further including the step of simultaneously activating a first open coil of said plurality of open coils and a first close coil of said plurality of close coils, both associated with a first fuel injector.

15. The method of claim 13 wherein the plurality of pairs of coils is eight pairs of coils, said step b) further includes selectively connecting two of the open coils to a power source with one of the plurality of high side gates, said step c) further includes selectively connecting four of the open coils to ground with a first low side gate, and said step d) further includes selectively connecting four of the close coils to ground with the second low side gate.

* * * * *